(12) United States Patent
Hsu et al.

(10) Patent No.: US 10,497,782 B2
(45) Date of Patent: Dec. 3, 2019

(54) TRENCH POWER SEMICONDUCTOR COMPONENT AND METHOD OF MANUFACTURING THE SAME

(71) Applicant: SUPER GROUP SEMICONDUCTOR CO., LTD., Hsinchu County (TW)

(72) Inventors: Hsiu-Wen Hsu, Hsinchu County (TW); Chun-Ying Yeh, Hsinchu (TW); Chun-Wei Ni, Hsinchu (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 0 days.

(21) Appl. No.: 15/975,023

(22) Filed: May 9, 2018

(65) Prior Publication Data

US 2018/0337236 A1 Nov. 22, 2018

(30) Foreign Application Priority Data

May 19, 2017 (TW) .............................. 106116662 A

(51) Int. Cl.
 *H01L 29/10* (2006.01)
 *H01L 29/423* (2006.01)
 *H01L 21/762* (2006.01)
 *H01L 29/06* (2006.01)

(52) U.S. Cl.
 CPC .... *H01L 29/1095* (2013.01); *H01L 21/76224* (2013.01); *H01L 29/0649* (2013.01); *H01L 29/0696* (2013.01); *H01L 29/4236* (2013.01)

(58) Field of Classification Search
 CPC ........... H01L 21/76224; H01L 29/1095; H01L 29/0649; H01L 29/0696; H01L 29/4236
 See application file for complete search history.

(56) References Cited

U.S. PATENT DOCUMENTS

| | | | | |
|---|---|---|---|---|
| 7,768,064 B2* | 8/2010 | Sapp | ..................... | H01L 29/407 257/330 |
| 7,872,305 B2* | 1/2011 | Hunt | ..................... | H01L 29/407 257/330 |
| 9,070,585 B2* | 6/2015 | Hossain | ................ | H01L 29/407 |
| 9,245,963 B2* | 1/2016 | Burke | ................... | H01L 29/407 |

FOREIGN PATENT DOCUMENTS

TW 201027628 A1 7/2010
TW I567979 B 1/2017

* cited by examiner

*Primary Examiner* — Matthew L Reames
(74) *Attorney, Agent, or Firm* — Li & Cai Intellectual Property (USA) Office

(57) ABSTRACT

The present disclosure provides a trench power semiconductor component and a manufacturing method thereof. The trench gate structure of the trench power semiconductor component is located in the at least one cell trench that is formed in an epitaxial layer. The trench gate structure includes a shielding electrode, a gate electrode disposed above the shielding electrode, an insulating layer, an intermediate dielectric layer, and an inner dielectric layer. The insulating layer covers the inner wall surface of the cell trench. The intermediate dielectric layer interposed between the shielding electrode and the insulating layer has a bottom opening. The inner dielectric layer interposed between the shielding electrode and the intermediate dielectric layer is made of a material different from that of the intermediate dielectric layer, and fills the bottom opening so that the space of the cell trench beneath the shielding electrode is filled with the same material.

10 Claims, 20 Drawing Sheets

TRENCH POWER SEMICONDUCTOR COMPONENT AND METHOD OF MANUFACTURING THE SAME

BACKGROUND OF THE INVENTION

1. Field of the Invention

The present disclosure relates to a trench power semiconductor component and a method of manufacturing the same; more particularly, to a trench power semiconductor component having a shielding electrode and a method of manufacturing the same.

2. Description of Related Art

Power loss in a conventional power metal oxide semiconductor field transistor (Power MOSFET) can be classified into two types, switching loss and conduction loss. Drain-to-gate capacitance is an important parameter in switching loss. A high drain-to-gate capacitance leads to the increase in switching loss, thereby limiting the switching rate of power MOSFETs. Therefore, a power MOSFET of high gate-to-drain capacitance is not suitable for high frequency circuits.

Power MOSFETs in the prior art include a shielding electrode located in the lower half part of the gate trench so as to reduce the gate-to-drain capacitance and increase the breakdown voltage without adversely affecting the on-resistance.

SUMMARY OF THE INVENTION

Accordingly, the present disclosure provides a trench power semiconductor component and a method of manufacturing the same decreasing the distribution density of the electric field at the bottom of the cell trench during a reverse bias is applied to the trench power semiconductor component by disposing an intermediate dielectric layer having a bottom opening in the cell trench and an inner dielectric layer filling the bottom opening.

One embodiment of the present disclosure provides a trench power semiconductor component including a substrate, an epitaxial layer, and a trench gate structure. The epitaxial layer is disposed on the substrate, the epitaxial layer having at least one cell trench formed therein. The trench gate structure is located in the at least one cell trench. The trench gate structure includes a shielding electrode, a gate electrode, an insulating layer, an intermediate dielectric layer and an inner dielectric layer. The shielding electrode is located in the lower half part of the at least one cell trench, and the gate electrode is disposed on the shielding electrode and insulated from the shielding electrode. The insulating layer covers an inner wall surface of the at least one cell trench. The intermediate dielectric layer is interposed between the insulating layer and the shielding electrode, the intermediate dielectric layer having a bottom opening located at a bottom side of the at least one cell trench. The inner dielectric layer is interposed between the intermediate layer and the shielding electrode. The inner dielectric layer and the intermediate dielectric layer are made of different materials, and the inner dielectric layer fills the bottom opening so that the portions of the trench gate structure located under the shielding electrode are made of the same material.

Another embodiment of the present disclosure provides a method of manufacturing a trench power semiconductor component. The method includes: forming a cell trench in the epitaxial layer; and forming a trench gate structure in the cell trench. The step of forming the trench gate structure in the trench further includes: forming an insulating layer covering an inner wall surface; forming an intermediate dielectric layer and an inner dielectric layer in the cell trench, in which the intermediate dielectric layer has a bottom opening located at a bottom side of the cell trench, and the inner dielectric layer cover the intermediate dielectric layer and fills the bottom opening; forming a heavily-doped semiconductor material in a lower half part of the cell trench; performing a thermal oxidation process so that a top portion of the heavily-doped semiconductor material is oxidized to form an inter-electrode dielectric layer and another portions of heavily-doped semiconductor material without being oxidized form a shielding electrode; and forming a gate electrode in an upper half part of the cell trench, in which the gate electrode is isolated from the shielding electrode by the inter-electrode dielectric layer.

In summary, since the portions of the trench power semiconductor component of the present disclosure formed at the bottom of the cell trench and under the shielding electrode are made of the same material, the distribution density of the electric field at the bottom of the cell trench can be reduced during a reverse bias is applied to the trench power semiconductor component, thereby improving the breakdown voltage of the trench power semiconductor component adversely affecting the on-resistance.

For further understanding of the present disclosure, the following embodiments are provided along with illustrations to facilitate the disclosure of the present disclosure.

DETAILED DESCRIPTION OF THE PREFERRED EMBODIMENTS

The aforementioned illustrations and following detailed description are exemplary for the purpose of further explaining the scope of the present disclosure. Other objectives and advantages related to the present disclosure will be illustrated in the following description and appended drawings.

Figure 1:
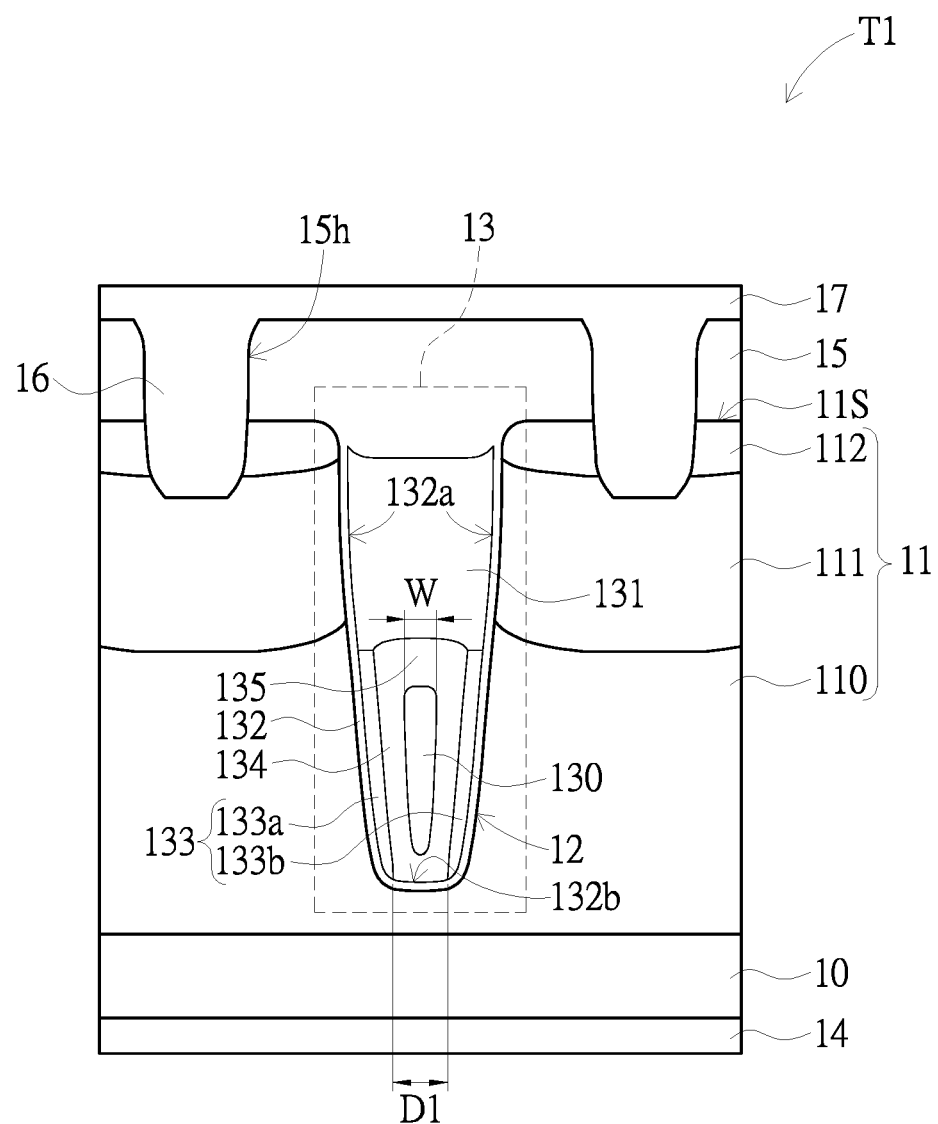
FIG. 1 is a partial sectional schematic view illustrating a trench power semiconductor component according to an embodiment of the present disclosure.

Referring to FIG. 1, the trench power semiconductor component T1 includes a substrate 10, an epitaxial layer 11, and a trench gate structure 13. The trench power semiconductor component T1 can be a trench power MOSFET or a semiconductor component having Schottky diodes. In the embodiment shown in FIG. 1, a trench power MOSFET is taken as an example to describe.

As shown in FIG. 1, the substrate 10 is heavily doped with first conductivity-type impurities to serve as a drain region of the trench power semiconductor component. The aforementioned first conductivity-type impurities can be N-type or P-type impurities.

The trench power semiconductor component T1 further includes a drain electrode 14 formed on the bottom side of the substrate 10 so as to be electrically connected to an external control circuit.

The epitaxial layer 11 is disposed on the substrate 10, the epitaxial layer 11 having the same conductivity type as that of the substrate 10, but the epitaxial layer 11 having lower doping concentration than that of the substrate 10.

Furthermore, in the embodiment of the FIG. 1, by doping impurities with different conductivity types and doping concentrations, the epitaxial layer 11 can be divided into a drift region 110, a base region 111, and a source region 112. The base region 111 and the source region 112 formed in the epitaxial layer 11 are adjacent to the sides of the trench gate structure 13, and the drift region 110 formed in the epitaxial layer 11 is positioned nearer to a side of the substrate 10. That is to say, the base region 111 and the source region 112 are located at an upper part of the epitaxial layer 11, and the drift region 110 is located at a lower part of the epitaxial layer 11.

Specifically, the base region 111 is formed by doping the second conductivity type impurities into the epitaxial layer 11, and the source region 112 is formed by heavily doping the first conductivity type impurities in the base region 111. The source region 112 is disposed above the base region 111, and the base region 111 has lower doping concentration than that of the source region 112.

Furthermore, in the present embodiment, the epitaxial layer 11 includes at least one cell trench 12 extending from a surface 11S of the epitaxial layer 11 to the drift region 110 in a direction perpendicular to the surface 11S. In the present disclosure, the cell trench 12 is substantially divided into an upper half part and a lower half part according to a reference level at which the bottom edge of the base region 111 is located.

As shown in FIG. 1, at least one trench gate structure 13 is disposed in the corresponding cell trench 12. The trench gate structure 13 includes a shielding electrode 130, a gate electrode 131, an insulating layer 132, an intermediate dielectric layer 133, and an inner dielectric layer 134.

The shielding electrode 130 is located in the lower half part of the cell trench 12. The cell trench 12 is deep trench, the deep trench assisting the trench power semiconductor component T1 in improving the breakdown voltage, but increasing the gate-to-drain capacitance and source/drain on resistance (Rdson). Accordingly, in the embodiment of the present disclosure, by disposing the shielding electrode 130 in the lower half part of the cell trench 12, the gate-to-drain capacitance (Cgd) can be reduced, thereby reducing the switching loss.

The shielding electrode 130 can be electrically connected to the source electrode, electrically floating, or to be biased by variable bias voltages. When the trench power semiconductor component T1 is operated in reverse bias, the shielding electrode 130 generates a pinch-off effect, such that the charge balance and the reduced surface field are generated, thereby improving the breakdown voltage. Accordingly, the doping concentration in the drift region 110 can be further increased, thereby reducing the on-resistance of the trench power semiconductor component.

The gate electrode 131 is disposed above and isolated from the shielding electrode 130. The gate electrode 131 and the shielding electrode 130 are insulated from each other. The gate electrode 131 and the shielding electrode 130 can be made of heavily-doped polysilicon. The bottom end of the gate electrode 131 is located at a horizontal plane that is lower than a lower edge of the base region 111. For example, in an NMOS transistor, when a positive bias larger than a threshold voltage is applied to the gate electrode 131, electrons are induced to accumulate at the sidewalls of the cell trench 12, thereby creating an inverse channel in the base region 111 and turning on the trench power semiconductor component T1. On the other hand, when a bias less than the threshold voltage is applied to the gate electrode 131, the trench power semiconductor component T1 is in OFF state.

The trench gate structure 13 further includes an inter-electrode dielectric layer 135 interposed between the shielding electrode 130 and the gate electrode 131 so as to isolate the gate electrode 131 from the shielding electrode 130. The inter-electrode dielectric layer 135 can be made of oxide (e.g. silicon oxide), nitride (e.g. silicon nitride), or the other insulator, which is not limited to the examples provided herein.

The insulating layer 132 covers the inner wall surface of the cell trench 12 and has a contour that roughly matches that of the inner wall surface of the cell trench 12. In the present embodiment, the gate electrode 131 is isolated from the base region 111 and the source region 112 by the insulating layer 132. The insulating layer 132 has two opposite inner sidewall surfaces 132a and a bottom surface 132b connected therebetween. The insulating layer 132 can be an oxide layer, such as silicon oxide, that is formed by a thermal oxidation process.

The intermediate dielectric layer 133 is disposed between the insulating layer 132 and the shielding electrode 130. In the present embodiment, the intermediate dielectric layer 133 is located at the lower half part of the cell trench 12 and covers the two opposite inner sidewall surfaces 132a of insulating layer 132. Specifically, the intermediate dielectric layer 133 includes a first wall portion 133a and a second wall portion 133b, which are respectively located at two opposite sides of the shielding electrode 130. A bottom end of the first wall portion 133a and a bottom end of the second wall portion 133b are separated from each other so as to form a bottom opening (not labeled).

In other words, the first wall portion 133a and the second wall portion 133b respectively cover the two inner sidewall surfaces 132a of the insulating layer 132; however, neither the first wall portion 133a nor the second wall portion 133b covers the bottom surface 132b of the insulating layer 132. In one preferred embodiment, a distance between the bottom end of the first wall portion 133a and the bottom end of the second wall portion 133b in a width direction of the cell trench 12, i.e., the width D1 of the bottom opening, in a direction parallel to a surface 11S of the epitaxial layer 11 is greater than the width W of the shielding electrode 130. That is to say, both the first wall portion 133a and the second wall portion 133b do not have any portion beneath the shielding electrode 130.

Furthermore, the thicknesses of the first and second wall portions 133a, 133b gradually decrease in a depth direction of the cell trench 12. In another embodiment, the thicknesses of the first and second wall portions 133a, 133b are substantially the same, instead of gradually decreasing, in the depth direction of the cell trench 12.

The inner dielectric layer 134 is positioned in the lower half part of the cell trench 12 and interposed between the intermediate dielectric layer 133 and the shielding electrode 130. To be more specific, the inner dielectric layer 134 is in contact with and surrounds two opposite side surfaces and a bottom surface of the shielding electrode 130. Furthermore, the inner dielectric layer 134 fills the bottom opening of the intermediate dielectric layer 133, thereby separating the bottom portion of the shielding electrode 130 from the epitaxial layer 11.

It is noting that the inner dielectric layer 134 and the insulating layer 132 are made of the same material that is different from the material of the intermediate dielectric layer 133 in the present embodiment. For example, the materials of the inner dielectric layer 134 and the insulating layer 132 can be silicon oxide, and the material of the intermediate layer 133 can be silicon nitride.

In other words, the space at the bottom of the cell trench 12 and beneath the shielding electrode 130 is filled with the same material. It is noting that when the trench power semiconductor component T1 is operated in reverse bias, the electric field strength near the bottom of the cell trench 12 is higher due to the curved bottom surface of the cell trench 12 having a smaller radius of the curvature. If the material which is located at the bottom of the cell trench 12, (i.e., the material between the curved bottom surface of the cell trench 12 and the shielding electrode 130) is a composite material or a multi-layer including more than one materials, the electric field will be easily distorted, and thus reducing the breakdown voltage of the trench power semiconductor component T1.

Accordingly, in the embodiment of the present disclosure, the bottom ends of the first and second wall portions 133a, 133b of the intermediate dielectric layer 133 are separated from each other to form the bottom opening, and the inner dielectric layer 134 fills the bottom opening, such that the material near the curved bottom surface of the cell trench 12 can be simple, thereby decreasing the distribution density of the electric field at the bottom of the cell trench and then increasing the breakdown voltage. Since the breakdown voltage is increased, the doping concentration of the drift region 110 can be further optimized so as to reduce the on-resistance, thereby enhancing the switching efficiency of the trench power semiconductor component T1.

Furthermore, the trench power semiconductor component T1 of the embodiment in the present disclosure further includes an interlayer dielectric layer 15, a plurality of conductive posts 16, and a conductive layer 17.

Please refer to FIG. 1. The interlayer dielectric layer 15 is disposed on the surface 11S of the epitaxial layer 11 to increase the flatness of the conductive layer 17. The interlayer dielectric layer 15 can be made of the material selected from a group consisting of borophosphosilicate glass (BPSG), phosphosilicate glass (PSG), oxide, nitride and any combination thereo.

Furthermore, the interlayer dielectric layer 15 includes a plurality of source contact windows 15h which extend from an upper surface of the interlayer dielectric layer 15 to the base region 111. The conductive layer 17 covers the interlayer dielectric layer 15 and can be electrically connected to the source region 112 by the conductive posts 16 which are respectively disposed in the source contact windows 15h. Furthermore, the conductive layer 17 can function as a source electrode of the trench power semiconductor component T1 for electrically connecting to an external control circuit. In another embodiment, the conductive layer 17 can be electrically connected to the gate electrode 131 or the shielding electrode 130.

Figure 2:
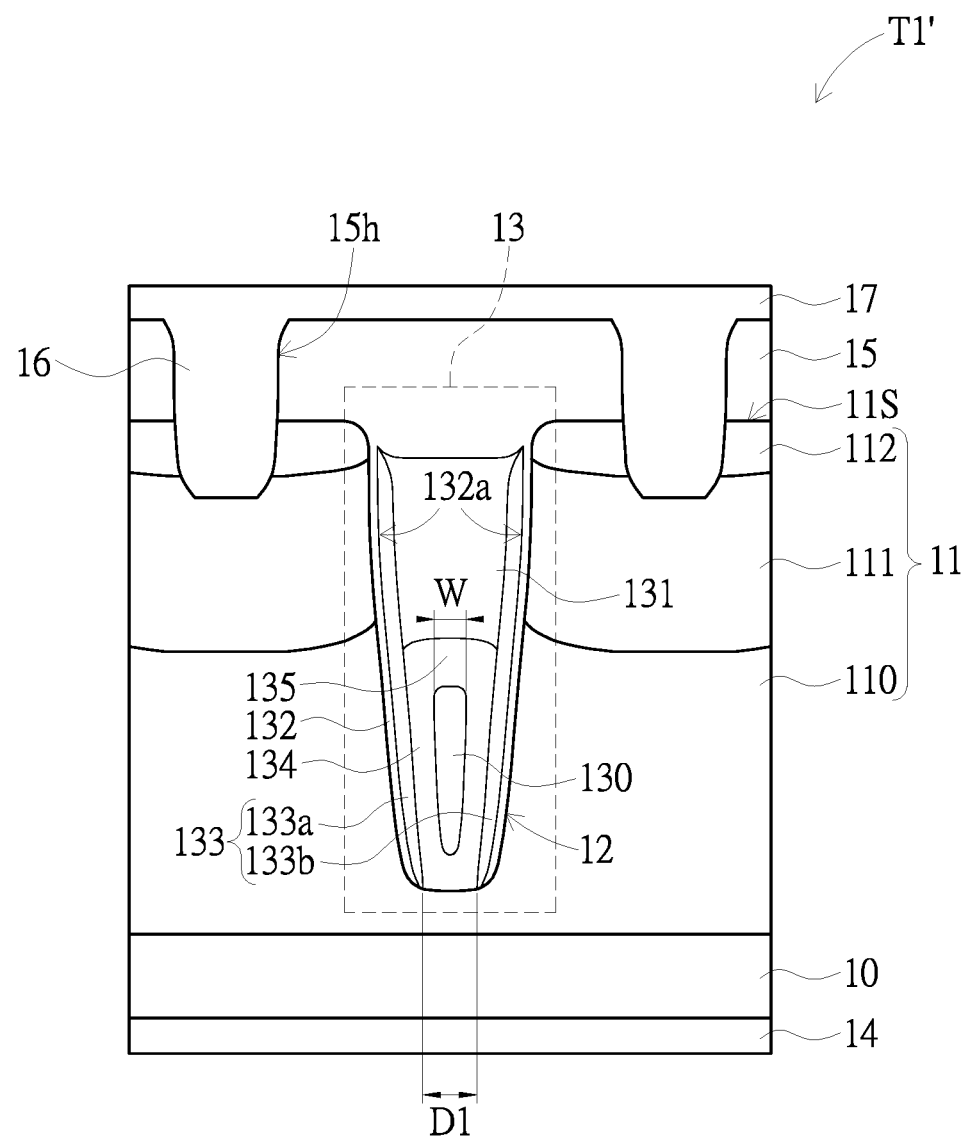
FIG. 2 is a partial sectional schematic view illustrating a trench power semiconductor component according to another embodiment of the present disclosure.

Please refer to FIG. 2. The same reference numerals are given to the same elements of the trench power semiconductor component T1' in the present embodiment corresponding to those in FIG. 1, and descriptions of the common portions are omitted. In trench power semiconductor component T1' of the present embodiment, both the first wall portion 133a and the second wall portion 133b of the intermediate dielectric layer 133 extend from the upper half part to the lower half part of the cell trench 12.

Accordingly, in the present embodiment, a part of the first wall portion 133a and a part of the second wall portion 133b, both of which are located at the upper half part of the cell trench 12, are respectively located at two opposite sides of the gate electrode 131. The first wall portion 133a and the second wall portion 133b respective cover two inner sidewall surfaces 132a of the insulating layer 132. Therefore, in the present embodiment, a part of the insulating layer 132 in conjunction with a part of the intermediate dielectric layer 133 located at the upper half part of the cell trench 12 function as a gate insulating layer.

In the present embodiment, the insulating layer 132 and the intermediate dielectric layer 133 are made of two different materials to function as the gate insulating layer so as to modify the work function difference between the gate electrode 131 and the base region 111, thereby reducing the leakage current when the trench power semiconductor component T1' is operated in a reverse bias.

Furthermore, in the embodiment shown in FIG. 1, the bottom surface 132b of the insulating layer 132 is located above the bottom surface of the cell trench 12, and the inner dielectric layer 134 covers the bottom surface 132b of the insulating layer 132, the inner dielectric layer 134 thus being spaced apart from the bottom surface of the cell trench 12. However, in the present embodiment, the inner dielectric layer 134 is in contact with the bottom surface of the cell trench 12. Accordingly, the bottom space of the cell trench 12 is filled with the inner dielectric layer 134 so as to decrease the electric field strength near the bottom of the cell trench 12. Therefore, in the present embodiment, it is not necessary that the material of the inner dielectric layer is the same as that of the insulating layer 132.

Figure 3:
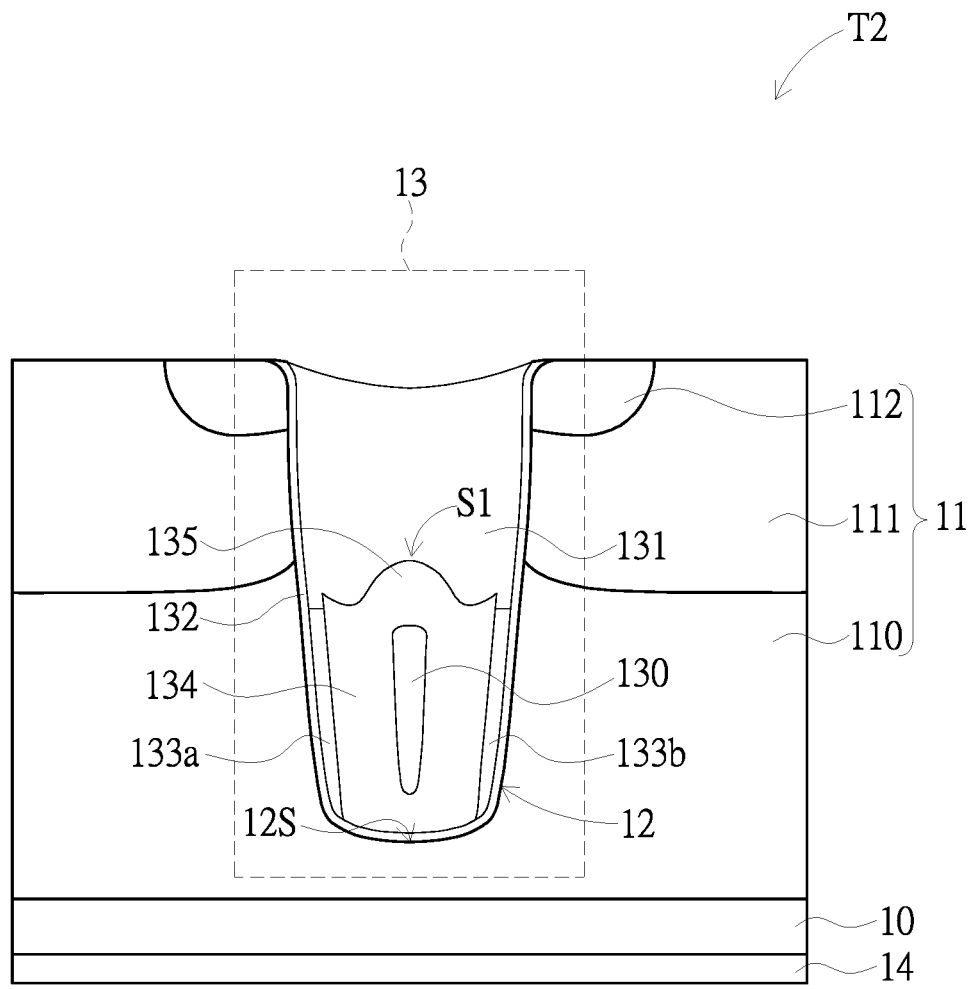
FIG. 3 is a partial sectional schematic view illustrating a trench power semiconductor component according to yet another embodiment of the present disclosure.
Figure 4:
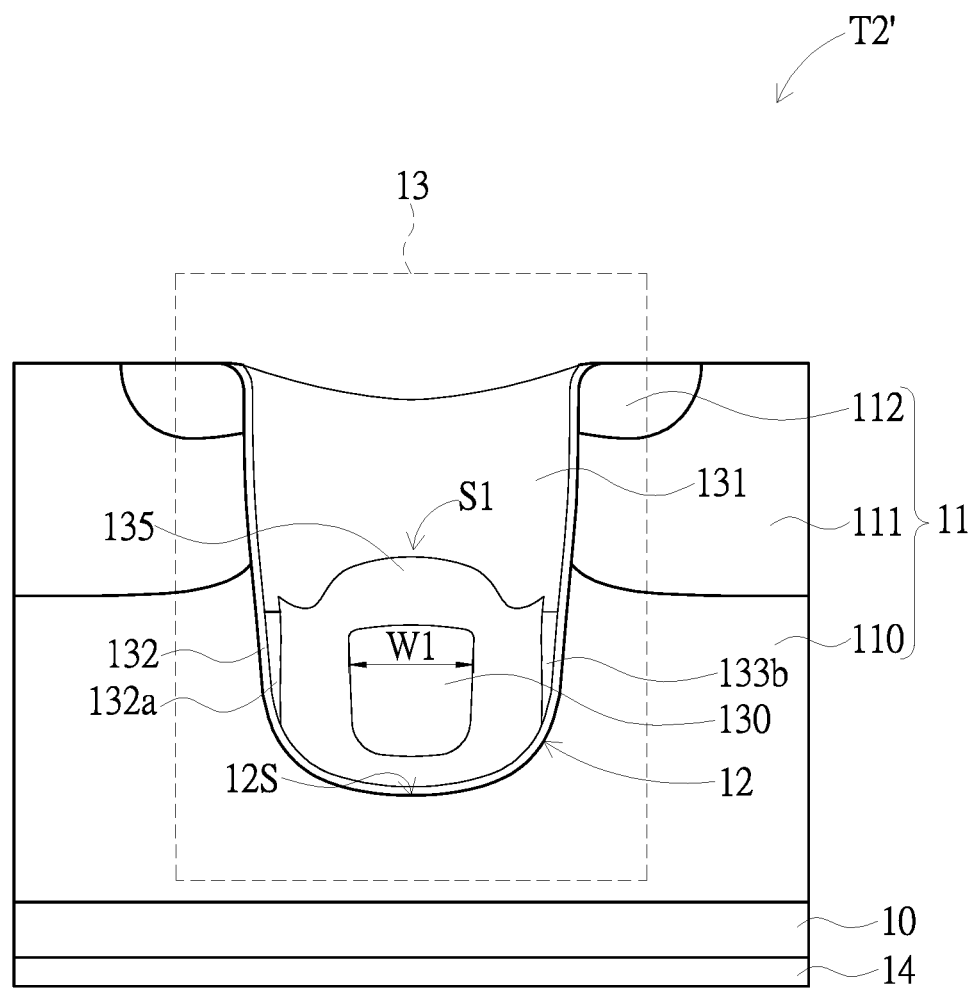
FIG. 4 is a partial sectional schematic view illustrating a trench power semiconductor component according to yet another embodiment of the present disclosure.

Please refer to FIG. 3 and FIG. 4. Compared to the embodiments respectively shown in FIG. 1 and FIG. 2, the cell trench 12 of the trench power semiconductor component T2 has a larger width in a direction parallel to the surface 11S of the epitaxial layer. Since the width of the cell trench 12 is larger, a curve-shaped bottom surface 12S of the cell trench has a greater radius of curvature, which decreases the distribution density of the electric field at the bottom of the cell trench 12. Through the technical solution mentioned above, the trench power semiconductor component T2 of the present embodiment can withstand a higher voltage and operate under a higher voltage, which ranges approximately from 60 V to 250 V.

Furthermore, compared to the embodiments shown in FIGS. 1-3, the trench power semiconductor component T2 of FIG. 4 has a shielding electrode 130 of a larger width W1, which contributes to a smaller gate-to-drain capacitance (Cgd). In the embodiments shown in FIG. 3 and FIG. 4, the top surface of the inter-electrode dielectric layer 135 and the top surface the inner dielectric layer 134 are connected to each other and commonly forms a mountain-shaped curve S1, the peak of which is located right above the shielding electrode 130.

Figure 5:
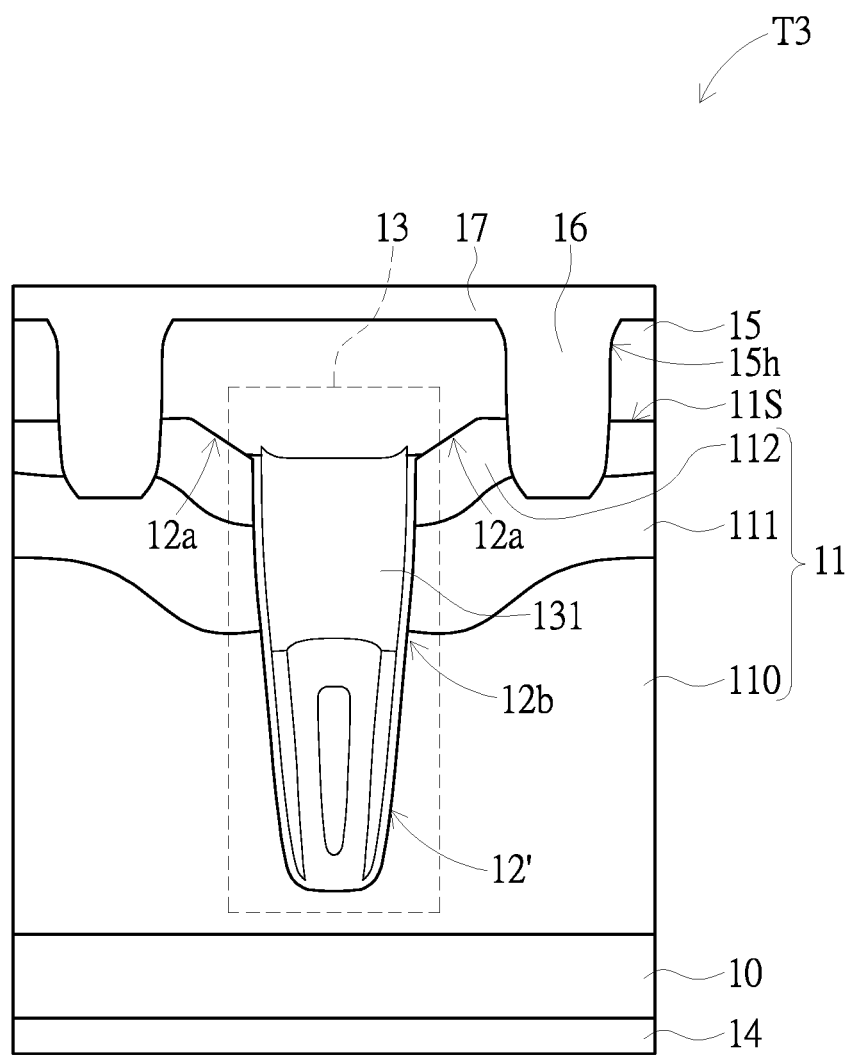
FIG. 5 is a partial sectional schematic view illustrating a trench power semiconductor component according to yet another embodiment of the present disclosure.

Please referring to FIG. 5, in the present embodiment, the cell trench 12' has an open-end portion 12a and a body portion 12b connected thereto. The inner surface of the open-end portion 12a is a slope extending from the surface 11S of the epitaxial layer 11 towards the body portion 12b. More specifically, the width of the open-end portion 12a decreases from the surface 11S of the epitaxial layer 11 along the depth direction of the trench 12'.

In this way, the cell trench 12' will not be closed by the thermal oxidation layer formed at the opening end 12a of the cell trench 12' when a thermal oxidation process is performed before the step of forming the gate electrode 131. Furthermore, in the present embodiment, an edge of the base region 111 and an edge of the source region 112 are inclined downward corresponding to an inclined direction of the slope of the open-end portion 12a.

Figure 6:
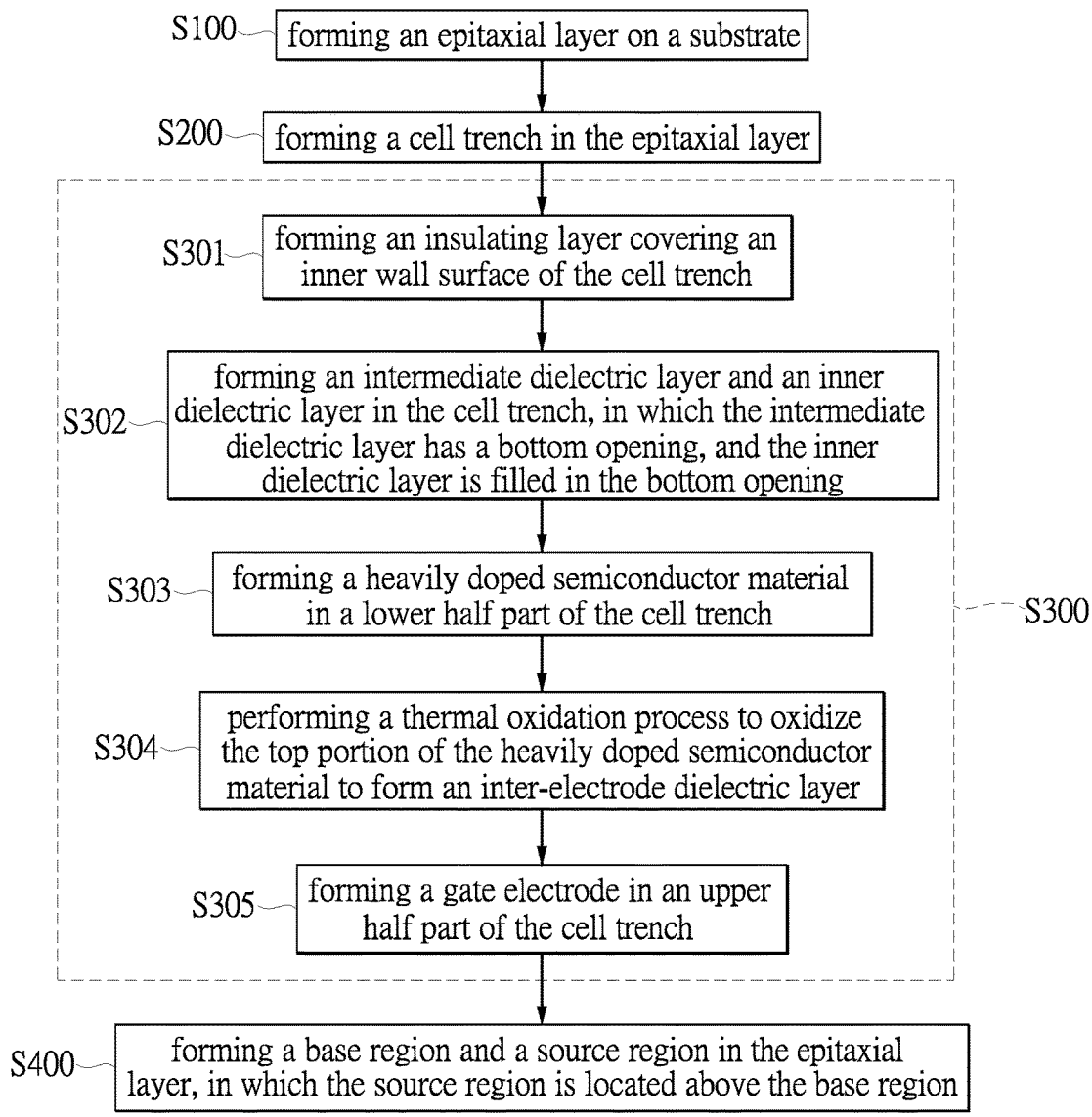
FIG. 6 is a flow chart illustrating a trench power semiconductor component according to an embodiment of the present disclosure

Please refer to FIG. 6. The method of the present disclosure at least includes a step S100 of forming an epitaxial layer on a substrate; a step S200 of forming a cell trench in the epitaxial layer; a step S300 of forming a trench gate structure in the trench, and a step S400 of forming a base region and a source region in the epitaxial layer, in which the source region is located above the base region.

It should be noted that the step S300 of forming the trench gate structure according to the present disclosure can includes a plurality of steps, which will be explained in the following description.

In step S301, an insulating layer is formed on the inner wall surface of the cell trench. Subsequently, in step S302, an intermediate dielectric layer and an inner dielectric layer are formed in the cell trench to cover the insulating layer, in which the intermediate dielectric layer has a bottom opening, and the inner dielectric layer covers the intermediate dielectric layer and fills the bottom opening.

Figure 7A:
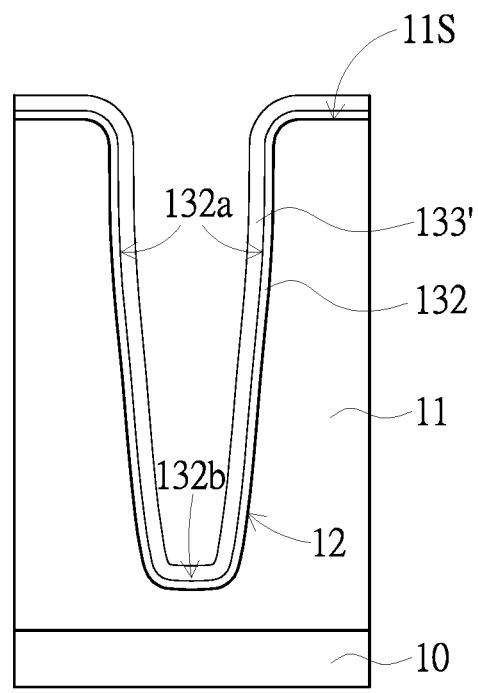
FIGS. 7A to 7H are partial sectional schematic views respectively illustrating each step of manufacturing a trench power semiconductor component according to an embodiment of the present disclosure.
Figure 7B:
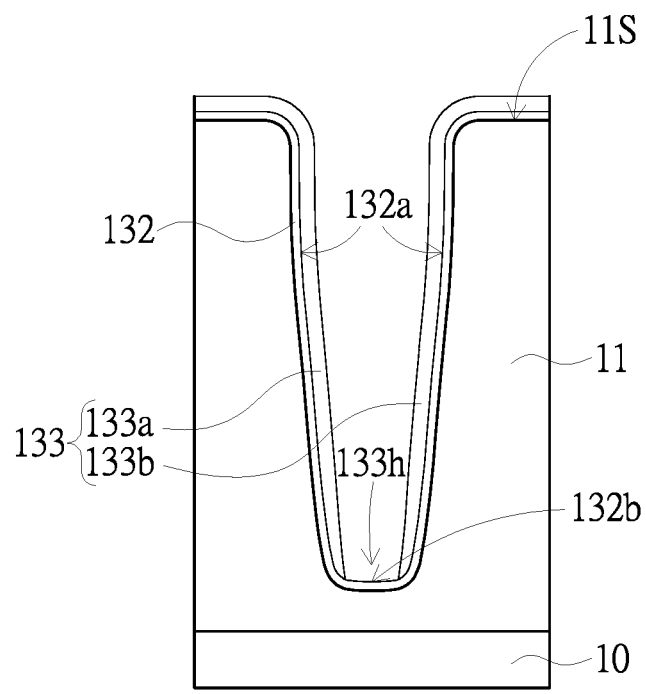
Figure 7C:
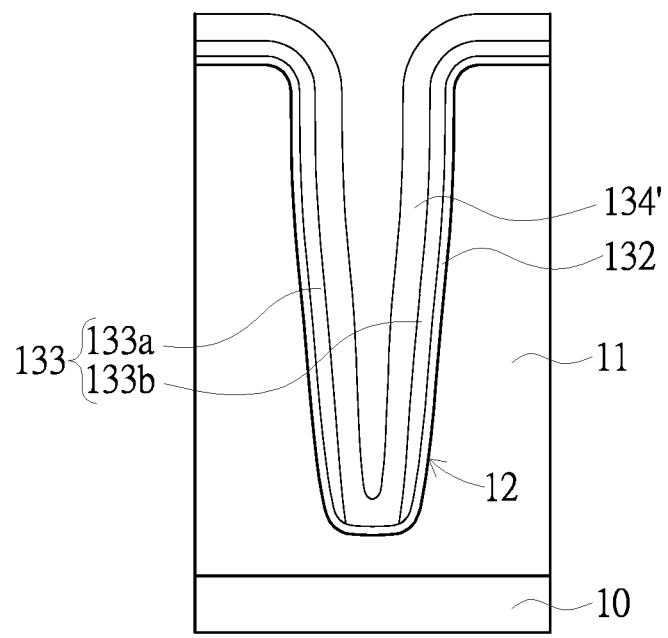

Please refer to FIGS. 7A to 7C, which show each process of the step S302 of the method of manufacturing trench power semiconductor component according to an embodiment of the present disclosure.

As shown in FIG. 7A, an epitaxial layer 11 has been formed on the substrate 10. Furthermore, a cell trench 12 has been formed in the epitaxial layer 11, and the insulating layer 132 has been formed on the inner wall surface of the cell trench 12, the insulating layer 132 having a contour that roughly matches that of the inner wall surface of the cell trench 12. The insulating layer 132 has two opposite inner sidewall surfaces 132a and a bottom surface 132b connected therebetween. In one embodiment, the insulating layer 132 is silicon oxide layer.

As shown in FIG. 7A, an initial intermediate dielectric layer 133' is formed, the initial intermediate dielectric layer 133' covering the surface 11S of the epitaxial layer 11, the inner sidewall surfaces 132a and the bottom surface 132b of the insulating layer 132. The initial intermediate dielectric layer 133' is made of different material from that of the insulating layer 132. In one embodiment, the initial intermediate dielectric layer 133' is a silicon nitride layer.

Furthermore, in one embodiment, the fabrication parameters of the initial intermediate dielectric layer 133' can be controlled so that the thickness of the initial intermediate dielectric layer 133' gradually decreases from the surface 11S of the epitaxial layer 11 to a bottom of the cell trench 12.

Subsequently, referring to FIG. 7B, a portion of the initial intermediate dielectric layer 133' that covers the bottom surface 132b of the insulating layer 132 is removed so as to form the intermediate dielectric layer 133 having the bottom opening 133h. In other words, the intermediate dielectric layer 133 includes a first wall portion 133a and a second wall portion 133b respectively covering the two opposite inner sidewall surfaces 132a, and a bottom end of the first wall portion 133a and a bottom end of the second wall portion 133b are separated from each other to form the bottom opening 133h.

It should be noting that since the thickness of a portion of the initial intermediate dielectric layer 133' located on the epitaxial layer 11 is greater than that of another portions located in the cell trench 12, the portion of the initial intermediate dielectric layer 133' located on the epitaxial layer 11 would not be completely removed after a dry etching process, thereby forming the intermediate dielectric layer 133 having the bottom opening 133h. In another embodiment, the dry etching process can be performed through a photo mask to etch the portion of the initial intermediate dielectric layer 133' that is predetermined to be removed.

In another embodiment, it is likely that a portion of the insulating layer 132 located at the bottom of the cell trench 12 is also removed during the step of removing the bottom portion of the initial intermediate dielectric layer 133' covering the bottom surface 132b. That is to say, the portion of the insulating layer 132 located at the bottom of the cell trench 12 can be selectively removed or remained.

In one preferred embodiment, the width of the bottom opening 133h, i.e., the distance between the bottom ends of the first and second wall portions 133a, 133b, at least allow the bottom surface 132b of the insulating layer 132 or the bottom surface of the cell trench 12 to be exposed from the bottom opening 133h.

Subsequently, as shown in FIG. 7C, an initial inner dielectric layer 134' is formed on the surface 11S of the epitaxial layer 11 and in the cell trench 12. Furthermore, the initial inner dielectric layer 134' fills the bottom opening 133h of the intermediate dielectric layer 133.

In the present embodiment, the material of the initial inner dielectric layer 134' is different from that of the intermediate dielectric layer 133, but the same as that of the insulating layer 132. In one embodiment, both the insulating layer 132 and the initial inner dielectric layer 134' are silicon oxide layers, and the intermediate dielectric layer 133 is silicon nitride layer. As such, the bottom space beneath the shielding electrode 130 of the cell trench 12 can be filled with the same material.

Figure 7D:
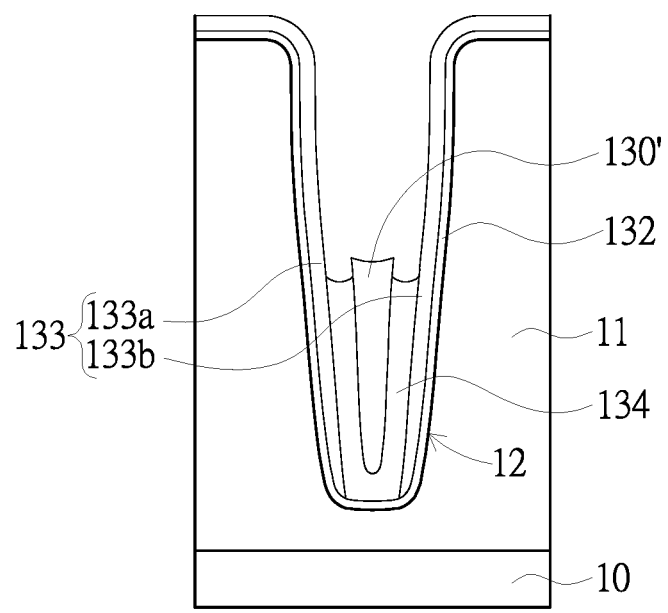

Please refer to FIG. 6 and FIG. 7D. Subsequently, in step S303, a heavily doped semiconductor material is formed in the lower half part of the cell trench. As shown in FIG. 7D, the heavily doped semiconductor material 130' has been formed in the cell trench 12. In one embodiment, a polycrystalline silicon layer can first be formed covering the epitaxial layer 11 and the cell trench 12 disposed therein, and then the polycrystalline silicon layer is etched back, in which only the polycrystalline silicon layer in the lower half part of the cell trench 12 is left un-etched so as to form the heavily doped semiconductor material 130'. The heavily doped semiconductor material 130' can be doped poly-Si containing selected conductivity-determining impurities.

Thereafter, the method of manufacturing the trench power semiconductor component according to one embodiment of the present disclosure further includes a step of removing the initial inner dielectric layer 134' located in the upper half part of the cell trench 12 so as to form the inner dielectric layer 134 located in the lower half part of the cell trench 12. In one embodiment, the initial inner dielectric layer 134' located in the upper half part of the cell trench 12 can be removed by performing a selective etching process with the intermediate dielectric layer 133 and the heavily doped semiconductor material 130' functioning as a mask.

Figure 7E:
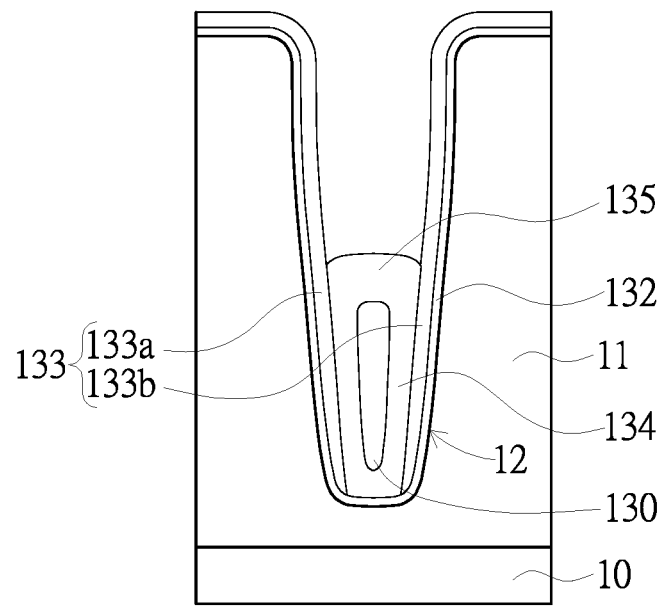

Please refer to FIG. 6 and FIG. 7E. In step S304, a thermal oxidation process is performed to oxidize a top portion of the heavily doped semiconductor material for forming an inter-electrode dielectric layer. As shown in FIG. 7E, after the thermal oxidation process, the top portion of the heavily doped semiconductor material 130' is oxidized to form the inter-electrode dielectric layer 135. Furthermore, the portion of the heavily doped semiconductor material 130' that is left un-oxidized forms the shielding electrode 130.

Figure 7F:
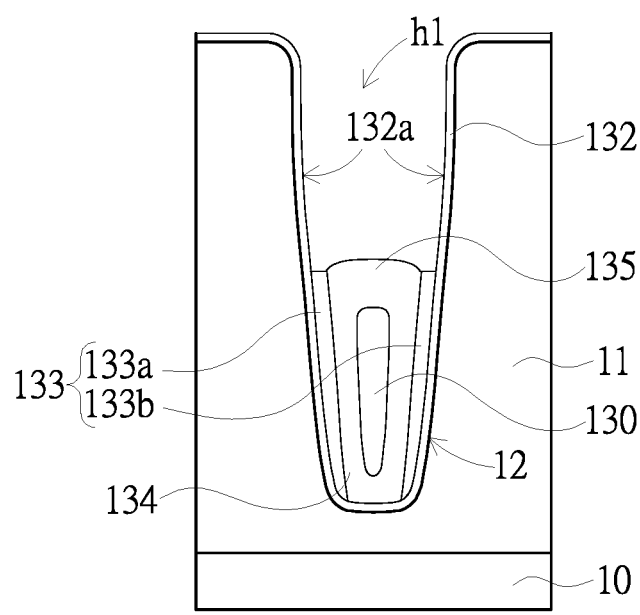

Please refer to FIG. 7F. In the present embodiment, parts of the first and second wall portions 133a, 133b that is located in the upper half part of the cell trench 12 are removed, thereby forming the first wall portion 133a and the second wall portion 133b of the embodiment shown in FIG. 1. That is to say, the first and second wall portions 133a, 133b are respectively located at two opposite sides of the shielding electrode 130 and only cover the lower parts of the two inner sidewall surfaces 132a of the insulating layer 132, respectively. In one embodiment, a selective etching process can be performed to remove the parts of the first and second wall portions 133a, 133b that is located in the upper half part of the cell trench 12. It is noting that the step shown in FIG. 7F can be omitted in another embodiment.

Figure 7G:
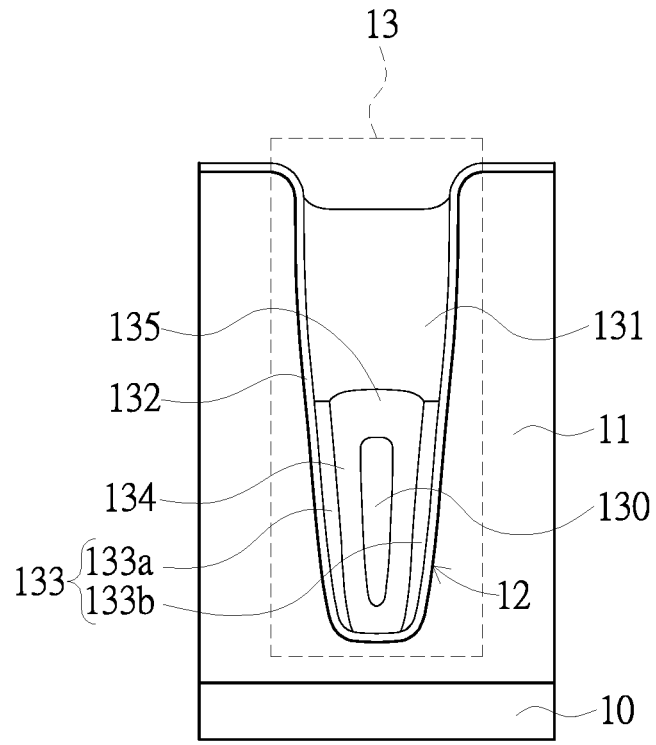

Please refer to FIG. 6 and FIG. 7G. Subsequently, in step S305, a gate electrode is formed in the upper half part of the cell trench. As shown in FIG. 7G the gate electrode 131 is formed in the cell trench 12 and disposed above the shielding electrode 130.

Specifically, in the previous step shown in FIG. 7F, the insulating layer 132, the intermediate dielectric layer 133, the inner dielectric layer 134 and the inter-electrode dielectric layer 135 jointly define a groove h1 in the cell trench 12. Accordingly, in the step of forming the gate electrode 131, a heavily doped polycrystalline silicon can first be formed covering the epitaxial layer 11 and the groove h1 disposed therein, and then the heavily doped polycrystalline silicon is etched back so as to form the gate electrode 131. By performing the abovementioned steps S301 to S305, the trench gate structure 13 of the trench power semiconductor component T1 shown in FIG. 1 can be fabricated.

Figure 7H:
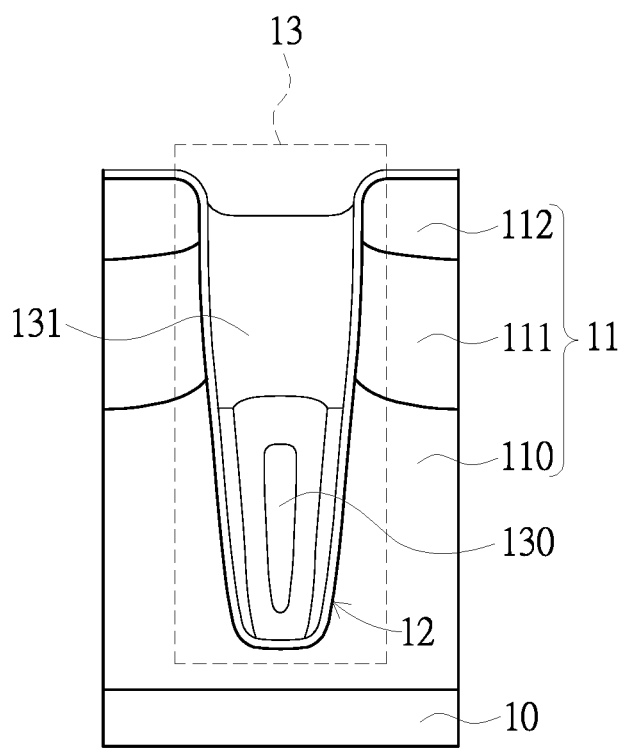

Please refer to FIG. 6 and FIG. 7H. Thereafter, in step S400, a base region and a source region are formed in the epitaxial layer, in which the source region is located above the base region.

Specifically, a base doping process is performed on the epitaxial layer 11 to form a lightly-doped region in the epitaxial layer 11, in which the lightly-doped region has a conductivity type opposite to that of the epitaxial layer 11. Subsequently, a source doping region is performed on the lightly-doped region so as to form a highly-doped region having a conductivity type opposite to that of the lightly-doped region. A drive-in process is then performed so that the impurities in the lightly-doped region and the impurities in the highly-doped region diffuse, thereby forming the base region 111 and the source region 112 located above the base region 111.

In the present embodiment, the lower edge of the base region 111 is located at a level that is higher than the top ends of the first and second wall portions 133a, 133b.

Next, a redistribution layer can be formed on the epitaxial layer 11 so that the source region 112, the gate electrode 131, and the shielding electrode 130 can be electrically connected to the external control circuit. The redistribution layer can be formed by any conventional technique, and the other details should be easily understood by one of ordinary skill in the art according to the abovementioned embodiments and then omitted herein.

Please refer to FIGS. 8A to 8F, which are partial sectional schematic views respectively illustrating each step of manufacturing a trench power semiconductor component according to another embodiment of the present disclosure. The steps respectively shown in FIGS. 8A to 8F can be performed after the step shown in FIG. 7A to fabricate the trench power semiconductor component T1' shown in FIG. 2.

Figure 8A:
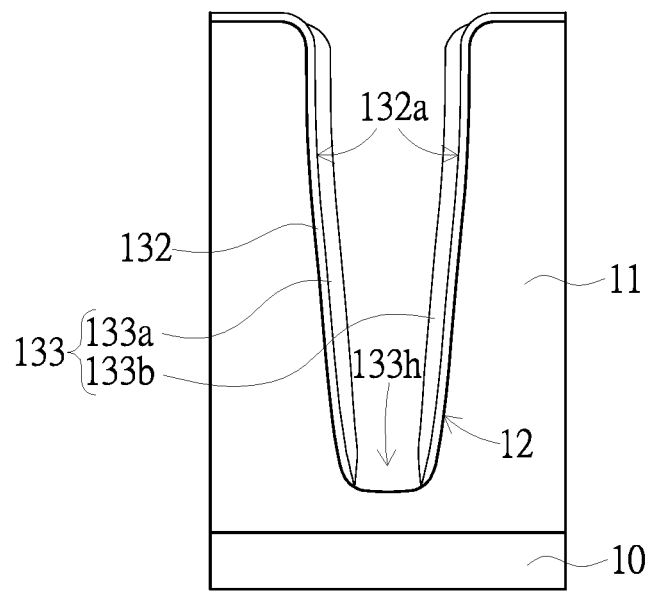
FIGS. 8A to 8F are partial sectional schematic views respectively illustrating each step of manufacturing a trench power semiconductor component according to another embodiment of the present disclosure.

In other words, before the step shown in FIG. 8A, the epitaxial layer 11 has been formed on the substrate 10, and the cell trench 12 has been formed in the epitaxial layer 11, as shown in FIG. 7A. Moreover, the insulating layer 132 and the initial intermediate dielectric layer 133' have been formed in the cell trench 12, the initial intermediate dielectric layer 133' covering the surface 11S of the epitaxial layer 11, two opposite inner sidewall surfaces 132a and the bottom surface 132b of the insulating layer 132.

In the present embodiment, the initial intermediate dielectric layer 133' does not vary in thickness along the depth direction of the cell trench 12. In other words, the initial intermediate dielectric layer 133' has substantially the same thickness at the portion on the epitaxial layer 11 and another portions located in the bottom of the cell trench 12.

Subsequently, as shown in FIG. 8A, the portion of the initial intermediate dielectric layer 133' covering the bottom surface 132b of the insulating layer 132 is removed to form the intermediate dielectric layer 133 having the bottom opening 133h. Meanwhile, the portion of the initial intermediate dielectric layer 133' disposed on the epitaxial layer 11 is removed.

In one embodiment, the portions of the initial intermediate dielectric layer 133' respectively disposed on the epitaxial layer 11 and covering the bottom surface 132b of the insulating layer 132 are removed by performing a dry etching process. It is noting that since the dry etching process is an anisotropic etching process, in which the etching rate in the downward direction is far faster than that in the lateral direction, it ensures that the portions of the initial intermediate dielectric layer 133' which respectively cover the two inner sidewall surfaces 132a of the insulating layer 132 can be left after the dry etching step, thereby forming the intermediate dielectric layer 133 having the bottom opening 133h.

The intermediate dielectric layer 133 of the present embodiment, includes the first wall portion 133a and the second wall portion 133b, the first wall portion 133a and the second wall portion 133b respectively covering two opposite inner sidewall surfaces 132a. Moreover, the bottom end of the first wall portion 133a and the bottom end of the second wall portion 133b are separated from each other so as to form the bottom opening 133h.

It is worth noting that after the portion of the initial intermediate dielectric layer 133' which covers the bottom surface 132b of the insulating layer 132 is removed by the dry etching process, the bottom portion of the insulating layer 132 that is located at the bottom of the cell trench 12 is further removed to expose the bottom surface of the cell trench 12 in the present embodiment.

Figure 8B:
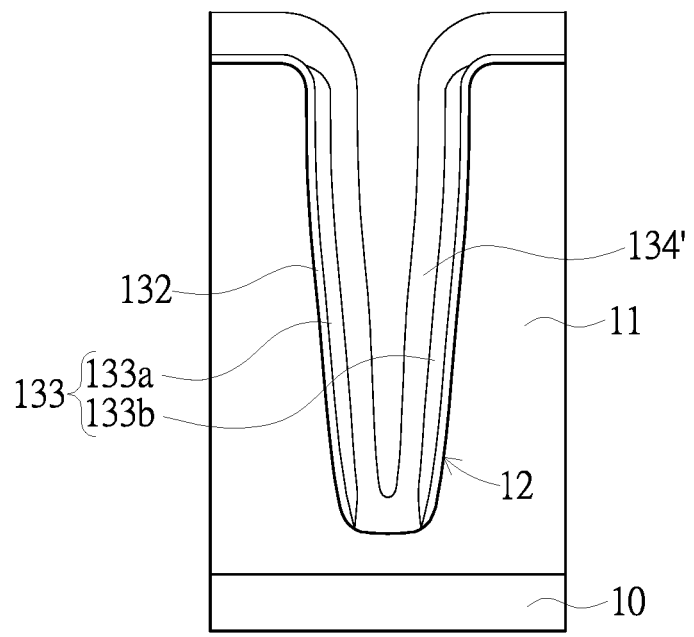

Please refer to FIG. 8B. Next, the initial inner dielectric layer 134' is formed on the epitaxial layer 11 and in the cell trench 12. The initial inner dielectric layer 134' fills the bottom opening 133h of the intermediate dielectric layer 133 and covers the bottom surface of the cell trench 12. The material of the initial inner dielectric layer 134' is different from that of the intermediate dielectric layer 133, but the same as that of the insulating layer 132.

Figure 8C:
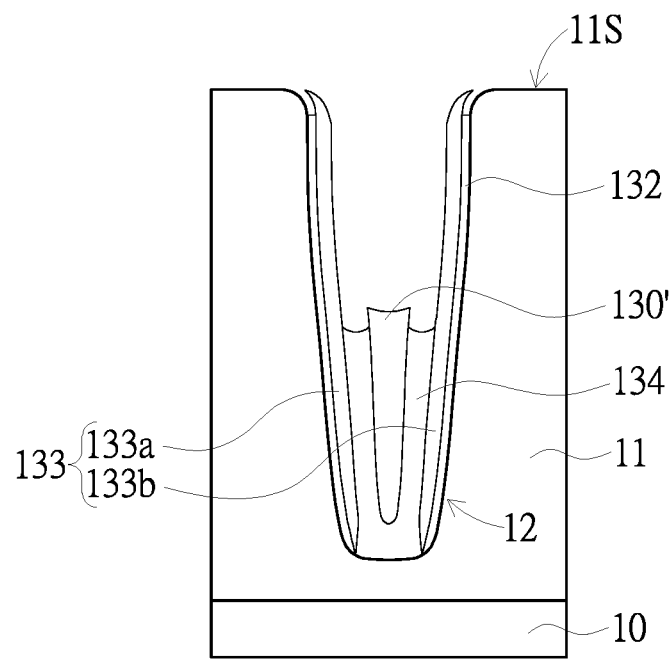

Please refer to FIG. 8C. After the heavily doped semiconductor material 130' is formed in the lower half part of the cell trench 12, portions of the initial inner dielectric layer 134' located on the epitaxial layer 11 and in the upper half part of the cell trench 12 are removed, in which the initial inner dielectric layer 134' in the lower half part of the cell trench 12 is left un-etched so as to form the inner dielectric layer 134 located in the lower half part of the cell trench 12. In one embodiment, the abovementioned steps can be carried out by performing a selective etching process.

In the previous steps, the portion of the initial intermediate dielectric layer 133' on the epitaxial layer 11 has been removed, and the initial inner dielectric layer 134' and the insulating layer 132 are made of the same material. Accordingly, a portion of the insulating layer 132 and the portion of initial inner dielectric layer 134' both of which are located on the epitaxial layer 11 can be removed during the same removing step to expose the surface 11S of the epitaxial layer 11.

Figure 8D:
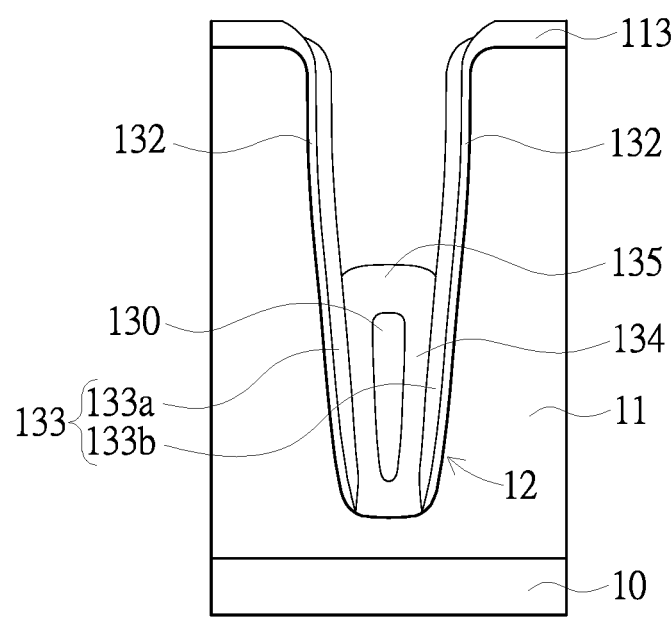

Please refer to FIG. 8D. Next, a thermal oxidation process is performed to oxidize the top portion of the heavily doped semiconductor material 130' so as to form the inter-electrode dielectric layer 135. Furthermore, the part of the heavily doped semiconductor material 130' that is left un-oxidized forms the shielding electrode 130. During the thermal oxidation process, the surface 11S of the epitaxial layer 11 is oxidized simultaneously and thus forming a thermal oxide layer 113.

Figure 8E:
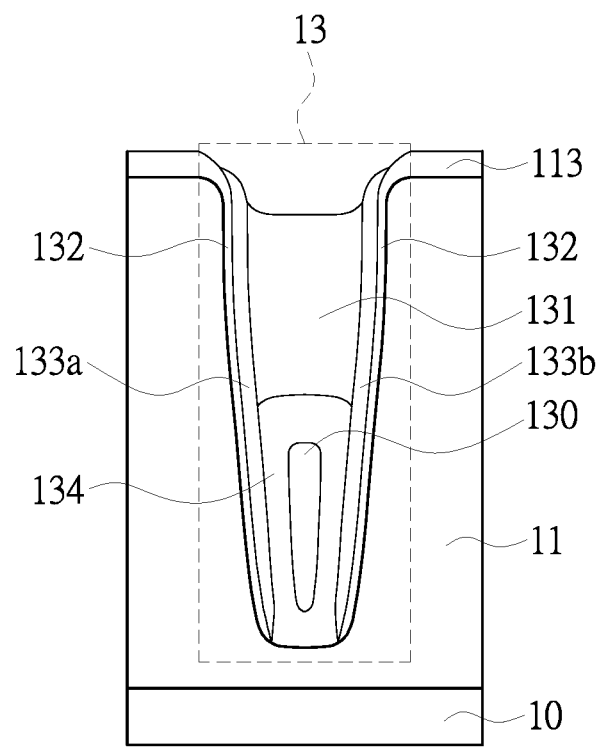

Please refer to FIG. 8E. The gate electrode 131 is formed in the cell trench 12 and disposed above the shielding electrode 130 so as to form the trench gate structure 13. In the present embodiment, after the thermal oxidation process, both of the parts of the first wall portion 133a and the second wall portion 133b located in the upper half part of the cell trench 12 remain un-etched. In this way, the first wall portion 133a (of the intermediate dielectric layer 133), the second wall portion 133b together with the insulating layer 132 serve as a gate insulating layer separating the gate electrode 131 from the epitaxial layer 11.

Figure 8F:
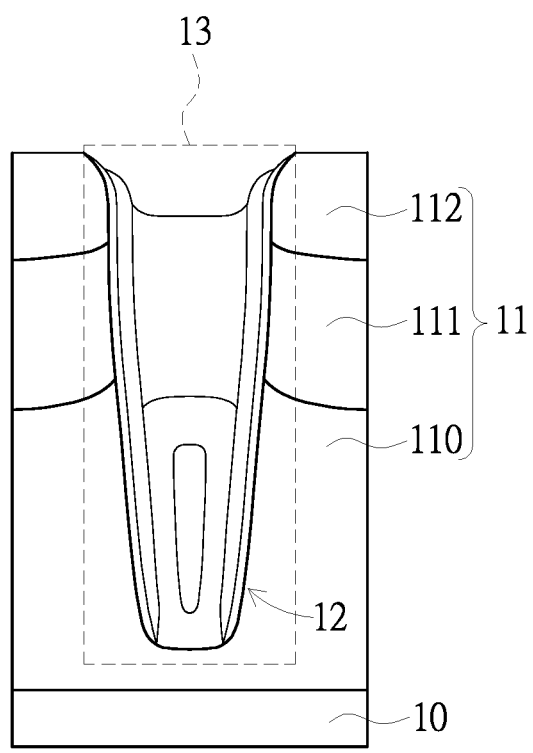

Please refer to FIG. 8F. Next, the base region 111 and the source region 112 are formed in the epitaxial layer 11. It is worth noting that in the present embodiment, before the step of forming the base region 111 and the source region 112, the thermal oxide layer 113 that has been formed on the epitaxial layer 11 can be thinned or completely removed so as to avoid any negative affect on the subsequent base doping process and the source doping process. Subsequently, the redistribution layer can be formed on the epitaxial layer 11 to form the trench power semiconductor component as shown in FIG. 2.

Figure 9A:
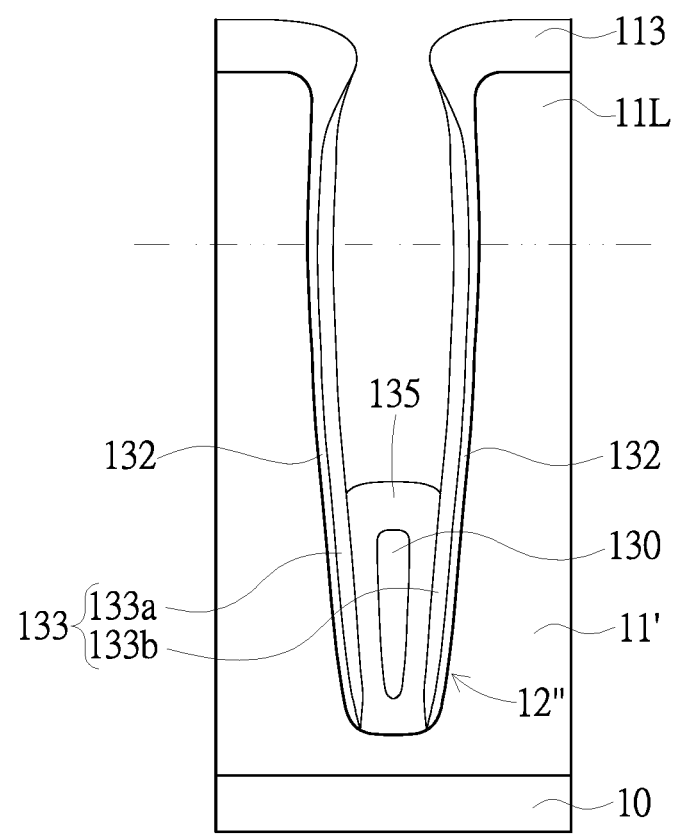
FIGS. 9A and 9C are partial sectional schematic views respectively illustrating each step of manufacturing a trench power semiconductor component according to yet another embodiment of the present disclosure.
Figure 9B:
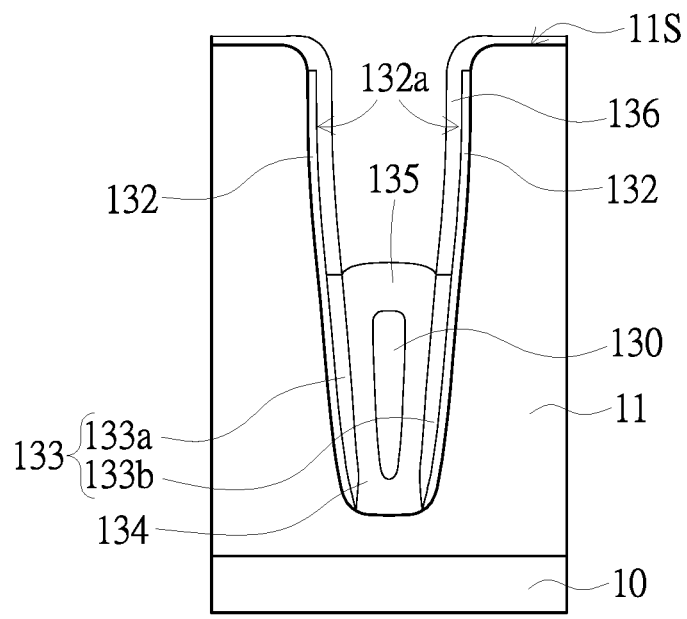
Figure 9C:
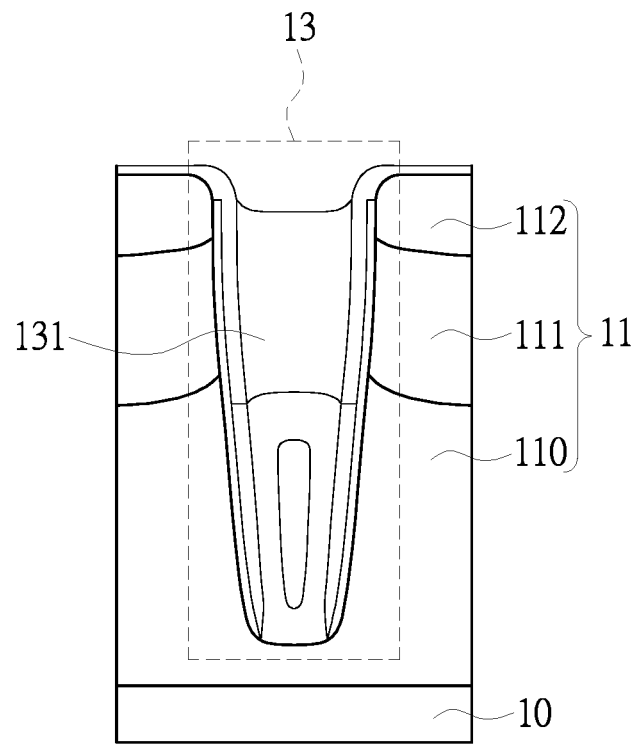

Please refer to FIGS. 9A to 9C, which are partial sectional schematic views respectively illustrating each step of manufacturing a trench power semiconductor component according to yet another embodiment of the present disclosure.

It should be noting that after performing the thermal oxidation process (the step S304 shown in FIG. 6), the surface 11S of the epitaxial layer 11 is also oxidized to form the thermal oxide layer 113. If the thermal oxide layer 113 located at the opening end of the cell trench 12 is too thick, the opening of the cell trench 12 will be covered by the thermal oxide layer 113, which may cause the gate electrode 131 to be difficultly formed in the cell trench 12.

To solve the above-mentioned problem, in the embodiment shown in FIG. 9A, a thicker initial epitaxial layer 11' and a deeper initial cell trench 12" formed therein are first formed on the substrate. In one embodiment, the thickness of the initial epitaxial 11 is greater than that of the epitaxial layer 11 shown in FIG. 7A or FIG. 8A by 0.5 μm.

Furthermore, after the thermal oxidation process is performed, the step of forming the trench gate structure further includes: removing the thermal oxide layer 113 disposed on the initial epitaxial layer 11' and a surface layer 11L of the initial epitaxial layer 11'.

In one embodiment, by performing a chemical mechanical planarization (CMP), the thermal oxide layer 113 disposed on the initial epitaxial layer 11' and a surface layer 11L of the initial epitaxial layer 11' can be removed.

Please refer to FIG. 9B. The portions of the first and second wall portions 133a, 133b located in the upper half part of the cell trench 12 can be removed by performing a selective etching step. Next, a dielectric layer 136 can be optionally formed to cover the surface 11S of the epitaxial layer 11 and the inner sidewall surfaces 132a of the insulating layer 132. The dielectric layer 136 can be an oxide layer or a nitride layer. Referring to FIG. 9C, the gate electrode 131 is formed in the cell trench 12 to form the trench gate structure 13. Subsequently, the base region 111, the source region 112 and redistribution layer are sequentially formed.

In another embodiment, the gate electrode 131 is formed in the cell trench 12 under the situation that the portions of the first and second wall portions 133a, 133b located in the upper half part of the cell trench 12 remain un-etched. In this case, the first wall portion 133a, the second wall portion 133b together with the insulating layer 132 serve as a gate insulating layer so as to optimize the work function difference between the gate electrode 131 and the base region 111, thereby reducing the leakage current during the operation of the trench power semiconductor component.

Figure 10A:
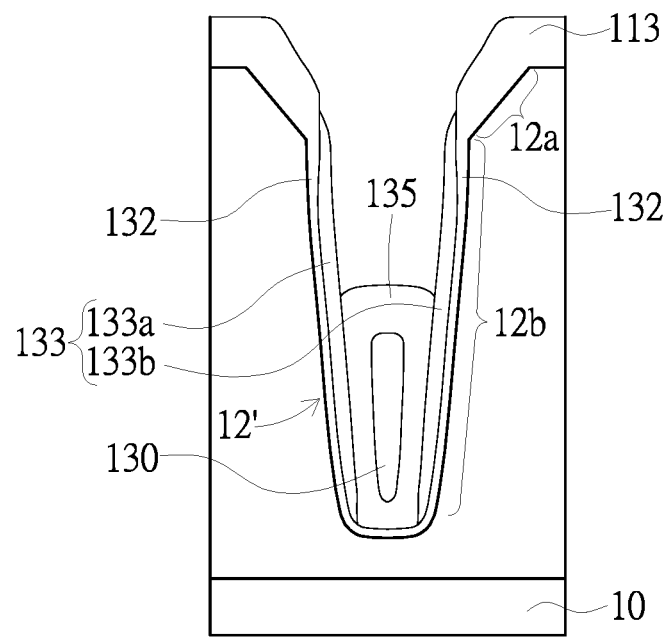
FIGS. 10A to 10B are partial sectional schematic views respectively illustrating each step of manufacturing a trench power semiconductor component according to yet another embodiment of the present disclosure.
Figure 10B:
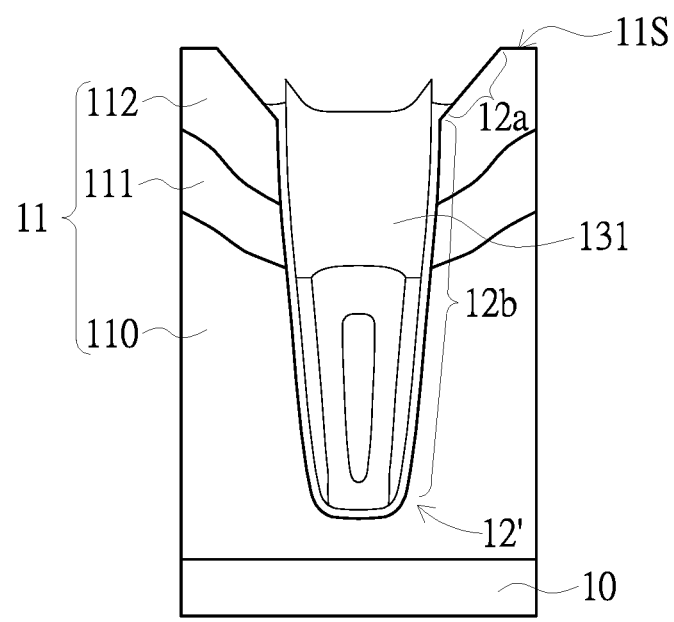

Please refer to FIG. 10A and FIG. 10B. In the present embodiment, the cell trench 12' has an open-end portion 12a and a body portion 12b connected thereto. The inner surface of the open-end portion 12a is a slope extending from the surface 11S of the epitaxial layer 11 towards the body portion 12b. More specifically, the width of the open-end portion 12a decreases from the surface 11S of the epitaxial layer 11 along the depth direction of the trench 12'.

In this way, the cell trench 12' will not be covered by the thermal oxide layer 113 that is formed at the open-end portion 12a of the cell trench 12' during the thermal oxidation process for forming the inter-electrode dielectric layer 135.

Please refer to FIG. 10B. Next, the gate electrode 131 is formed in the cell trench 12', and then the base region 111 and the source region 112 are formed in the epitaxial layer 11.

Specifically, after the gate electrode 131 is formed in the cell trench 12', the thermal oxide layer 113 formed on the epitaxial layer 11 and at the open-end portion 12a is removed to expose the surface 11S of the epitaxial layer 11. The thermal oxide layer 113 can be removed by a wet etching process. Subsequently, the base doping process, the source doping process and the drive-in process are performed to form the base region 111 and the source region 112 in the epitaxial layer 11, the source region 112 being located above the base region 111.

Since the inner surface of the open-end portion 12a is the slope, the doped regions formed by the base region doping process and the source region doping process will have a dopant profile that differs from that in the previous embodiments. More specifically, the lower edge of the base region 111 and that of the source region 112 incline downward as the slope incline towards the center of the trench gate structure.

Furthermore, in another embodiment, the inner dielectric layer 134 and the intermediate dielectric layer 133 can be formed by different steps. Please refer to FIGS. 11A to 11D, which are subsequent to the step shown in FIG. 7A and respectively illustrate the detailed steps of forming the inner dielectric layer 134 and the intermediate dielectric layer 133.

Figure 11A:
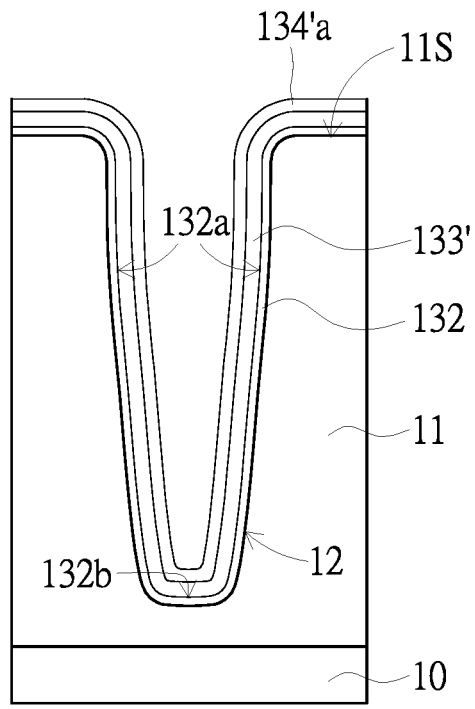
FIGS. 11A to 11D are partial sectional schematic views respectively illustrating each step of manufacturing a trench power semiconductor component according to yet another embodiment of the present disclosure.

That is to say, before the step shown in FIG. 11A, the insulating layer 132 and the initial intermediate dielectric layer 133' have been formed in the cell trench 12, in which the initial intermediate dielectric layer 133' covering the surface 11S of the epitaxial layer 11, two inner sidewall surfaces 132a and the bottom surface 132b of the insulating layer 132.

Subsequently, as shown in FIG. 11A, the first dielectric layer 134'a is formed to cover the surface of the initial intermediate dielectric layer 133'. The part of the first dielectric layer 134'a located on the epitaxial layer 11 has a thickness greater than that of another parts located at the bottom of the cell trench 12.

Figure 11B:
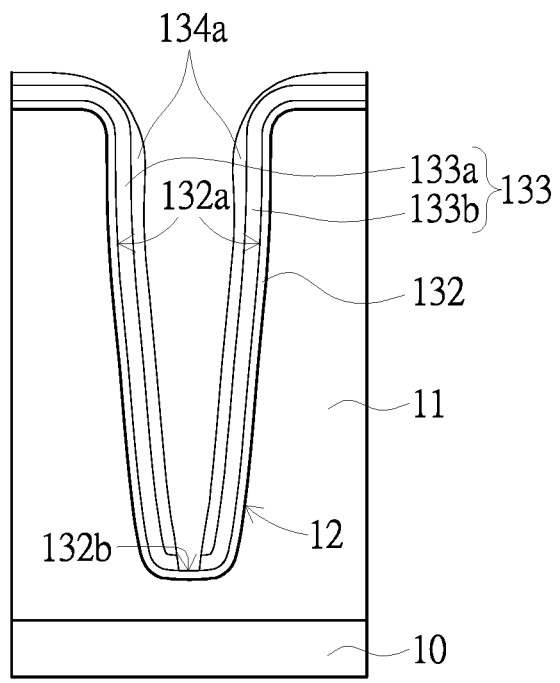

Next, referring to FIG. 11B, a part of the first dielectric layer 134'a and a part of the initial intermediate dielectric layer 133', which are located at the bottom of the cell trench 12, are removed so as to form the first dielectric layer 134a having a bottom-side opening and the intermediate dielectric layer 133 having the bottom opening. In the present embodiment, the bottom portion of the insulating layer 132 located at the bottom of the cell trench 12 can be remained. The aforementioned steps can be carried out by performing a dry etching process.

Figure 11C:
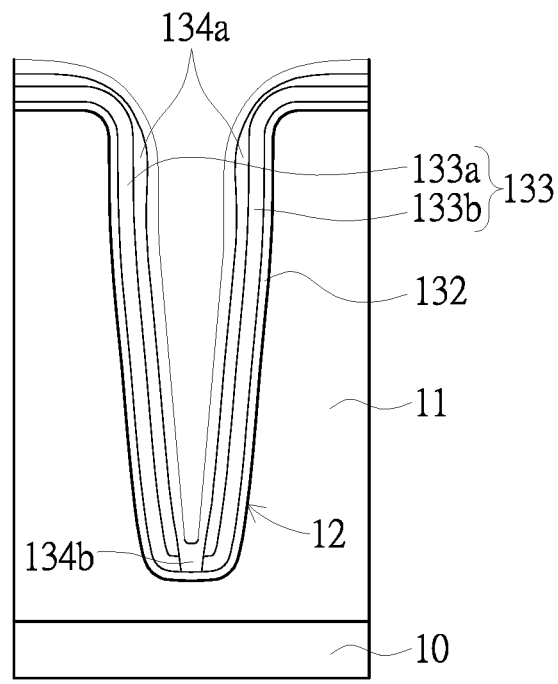

Next, as shown in FIG. 11C, a second dielectric layer 134b is formed to fill the bottom-end opening of the first dielectric layer 134a and the bottom opening of the intermediate dielectric layer. Accordingly, the bottom portion of the second dielectric layer 134b connects the bottom surface 132b of the insulating layer 132. Furthermore, in the present embodiment, the first dielectric layer 134a, the second dielectric layer 134b, and the insulating layer 132 are made of the same material, such as silicon oxide.

Figure 11D:
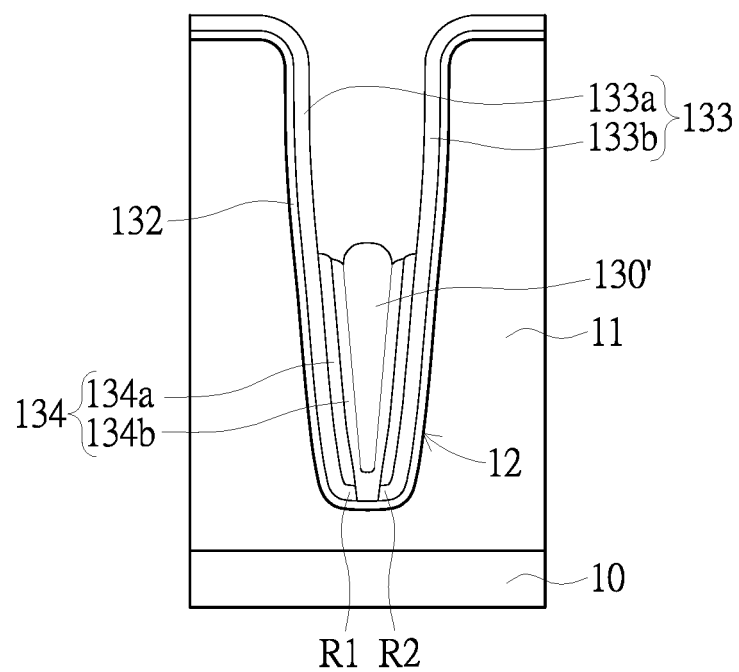

Please refer to FIG. 11D. After the formation of the heavily doped semiconductor material 130' located in the lower half part of the cell trench 12, an upper half portion of the first dielectric layer 134a and an upper half portion of the second dielectric layer 134b are removed, in which another parts of the first dielectric layer 134a and the second dielectric layer 134b located in the lower half part of the cell trench 12 are left un-etched.

The detailed steps of forming the heavily doped semiconductor material 130' have been explained in the aforementioned paragraphs relative to FIG. 7D and thus being omitted herein. It is noting that the first dielectric layer 134a together with the second dielectric layer 134b located in the lower half part of the cell trench 12 commonly form the inner dielectric layer 134.

Furthermore, the first and second wall portions 133a, 133b of the intermediate dielectric layer 113 formed by the aforementioned steps respective have two bending portions R1, R2, the bending portions R1, R2 extending from one toward the other of the inner sidewall surfaces 132a and being opposite to each other. However, the two bending portions R1, R2 are spaced apart from each other to form the bottom opening. Therefore, the two bending portions R1, R2 do not extending toward a region beneath the shielding electrode 130, and then overlap the shielding electrode 130 in the depth direction of the cell trench 12.

Subsequently, the step of forming the inter-electrode dielectric layer 135 is performed and followed by the steps of forming the gate electrode 131, the base region 111, and the source region 112.

Figure 12A:
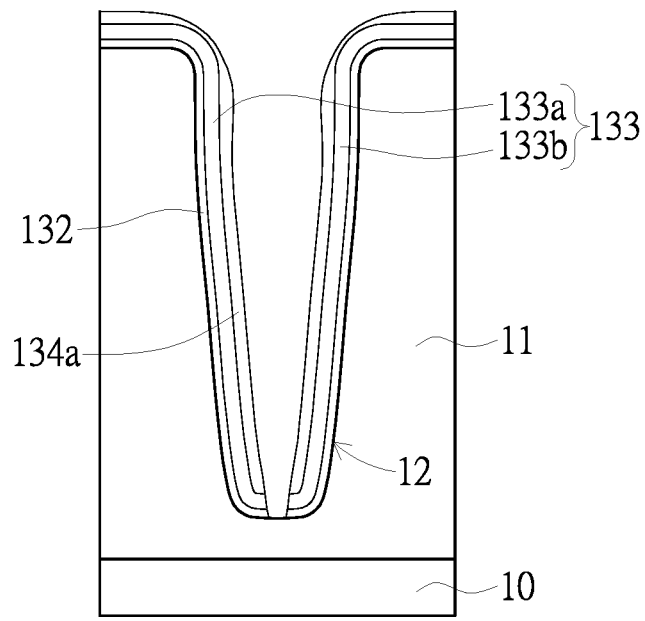
FIGS. 12A to 12C are partial sectional schematic views respectively illustrating each step of manufacturing a trench power semiconductor component according to yet another embodiment of the present disclosure.
Figure 12B:
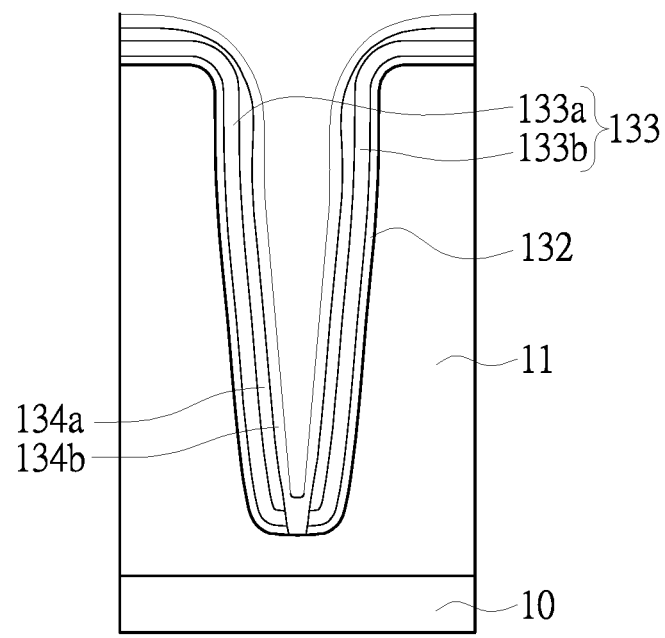
Figure 12C:
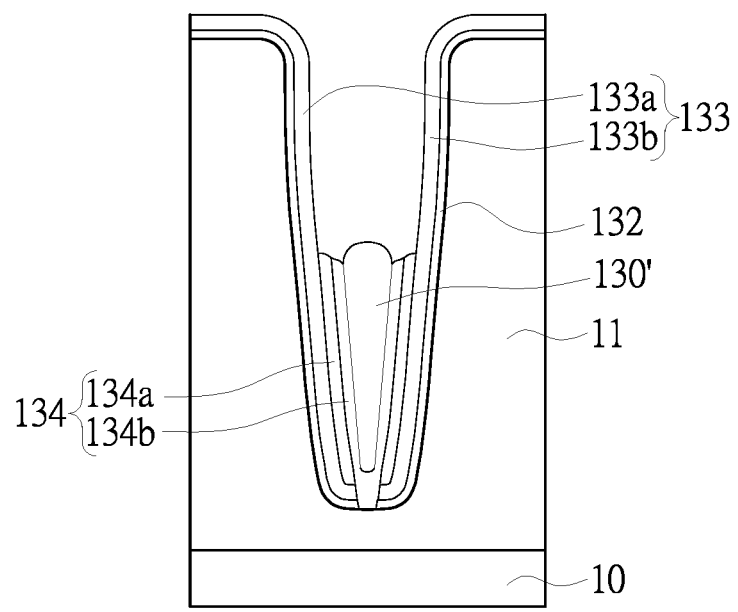

Please refer to FIGS. 12A to 12C, which is subsequent to the step shown in FIG. 11A. As shown in FIG. 12A, after the formation of the first dielectric layer 134a, the portion of the first dielectric layer 134a, the portion of the initial intermediate dielectric layer 133' the bottom portion of the insulating layer 132, which are located at the bottom of the cell trench 12, are removed during the same etching process so as to expose the bottom surface of the cell trench 12.

Please refer to FIG. 12B. Next, the second dielectric layer 134b is formed so as to fill the bottom-end opening of the first dielectric layer 134a and the bottom opening of the intermediate dielectric layer 133 and to cover the bottom surface of the cell trench 12. Accordingly, the second dielectric layer 134b can be in contact with the bottom surface of the cell trench 12.

Next, as shown in FIG. 12C, after the heavily doped semiconductor material 130' is formed in the lower half part of the cell trench 12, the portions of the first and second dielectric layers 134a, 134b located in the upper half part of the cell trench 12 are both removed.

Similar to the embodiment shown in FIG. 11D, in the present embodiment, the first and second dielectric layers 134a, 134b located in the lower half part of the cell trench 12 commonly form the inner dielectric layer 134.

In summary, the present disclosure provides the trench power semiconductor components T1, T1', T2, T2', T3 and the method of manufacturing the same, in which the intermediate dielectric layer 133 and the inner dielectric layer 134 which are made of different materials surround the shielding electrode 130, the intermediate dielectric layer 133 being interposed between the inner dielectric layer 134 and the insulating layer 132. The intermediate dielectric layer 133 has the bottom opening 133h located at the bottom side thereof, and the inner dielectric layer 134 fills the bottom opening 133h. In this way, when the trench power semiconductor components T1, T1', T2, T2', T3 are operated under a reverse bias, the bottom of the cell trench 12 will have a loose distribution of electric field due to the same material beneath the shielding electrode 130, thereby increasing the breakdown voltage without adversely affecting the on-resistance.

When the breakdown voltage is increased, the doping concentration of the drift region 110 can be further optimized so as to reduce the on-resistance, thereby enhancing the switching efficiency of the trench power semiconductor components T1, T1', T2, T2', T3. Based on simulations, it has been proven that the trench power semiconductor components T1, T1', T2, T2', T3 according to the embodiments of the present disclosure have smaller distribution densities and thus higher breakdown voltages. Therefore, the trench power semiconductor components T1, T1', T2, T2', T3 according to the embodiments of the present disclosure can decrease the on-resistance by 50%.

Furthermore, in the trench power semiconductor component T1' of the present disclosure, by using the insulating layer 132 together with the intermediate dielectric layer 133 which are respectively made of two different materials to function as the gate insulating layer, the work function difference between the gate electrode 131 and the base region 111 can be optimized, thereby reducing the leakage current when the trench power semiconductor component T1' is operated in a reverse bias.

Furthermore, the method of manufacturing a trench power semiconductor component of the present disclosure can be integrated into the current semiconductor fabrication process so as to provide the trench power semiconductor components T1, T1', T2, T2', T3 of the present disclosure.

The description illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A method of manufacturing a trench power semiconductor component, comprising:
    forming an epitaxial layer on a substrate;
    forming a cell trench in the epitaxial layer; and
    forming a trench gate structure in the cell trench;
    wherein the step of forming the trench gate structure in the cell trench further includes:
        forming an insulating layer covering an inner wall surface of the cell trench;
        forming an intermediate dielectric layer and an inner dielectric layer in the cell trench, wherein the intermediate dielectric layer has a bottom opening located at a bottom of the cell trench, and the inner dielectric layer covers the intermediate dielectric layer and fills the bottom opening;
        forming a heavily doped semiconductor material in a lower half part of the cell trench;
        performing a thermal oxidation process so as to oxidize a top portion of the heavily doped semiconductor material, thereby forming an inter-electrode dielectric layer, in which another portions of the heavily-doped semiconductor material are remained un-oxidized form a shielding electrode; and
        forming a gate electrode in an upper half part of the cell trench, wherein the gate electrode is isolated from the shielding electrode by the inter-electrode dielectric layer;
    wherein a thermal oxide layer is simultaneously formed on the epitaxial layer during the step of performing the thermal oxidation process, and thereafter the thermal oxide layer and a surface layer of the epitaxial layer are removed.

2. The method according to claim 1, wherein the intermediate dielectric layer includes a first wall portion and a second wall portion respectively located at two opposite sides of the shielding electrode, the bottom end of the first wall portion and the bottom end of the second wall portion are separated from each other so as to form the bottom opening, and a width of the bottom opening in a direction parallel to a surface of the epitaxial layer is greater than a width of the shielding electrode.

3. The method according to claim 2, wherein before the step of forming the gate electrode, the step of trench gate structure in the trench further includes: removing a portion of the first wall portion and a portion of second wall portion, which are located at the upper half part of the cell trench.

4. The method according to claim 2, wherein a thickness of the first wall portion and a thickness of the second wall portion both gradually decrease along a depth direction of the at least one cell trench.

5. The method according to claim 1, wherein the insulating layer has two opposite inner sidewall surfaces and a bottom surface connected the two opposite inner sidewall surfaces, and the step of forming the intermediate dielectric layer and the inner dielectric layer further includes: removing a bottom part of the insulating layer located at the bottom side of the cell trench so that the inner dielectric layer formed in subsequent step is in contact with a bottom portion of the cell trench.

6. The method according to claim 1, wherein the cell trench has an open-end portion and a body portion connected thereto, and an inner surface of the open-end portion is a slope extending from the surface of the epitaxial layer towards the body portion, the method further includes: forming a base region and a source region in the epitaxial layer, an edge of the base region and an edge of the source region being inclined downward corresponding to an inclined direction of the slope.

7. The method according to claim 1, wherein the step of forming the intermediate dielectric layer and the inner dielectric layer further includes:
    forming an initial intermediate dielectric layer covering the insulating layer;
    forming a first dielectric layer covering the initial intermediate dielectric layer;
    removing a part of the first dielectric layer and a part of the initial intermediate dielectric layer that are located at the bottom side of the cell trench, so as to form the intermediate dielectric layer having the bottom opening and the first dielectric layer having a bottom-side opening, the bottom opening and the bottom-side opening being in communicated with each other;
    forming a second dielectric layer filling the bottom opening of the intermediate dielectric layer and the bottom-side opening of the first dielectric layer; and
    removing an upper half portion of the first dielectric layer and an upper half portion of the second dielectric layer to form the inner dielectric layer after the step of forming the heavily-doped semiconductor material in the lower half part of the cell trench.

8. The method according to claim 7, wherein a bottom part of the insulating layer located at the bottom side of the cell trench is removed during the step of forming the intermediate dielectric layer having the bottom opening so that the second dielectric layer is in contact with a bottom surface of the cell trench after the step of forming the second dielectric layer.

9. A method of manufacturing a trench power semiconductor component, comprising:
forming an epitaxial layer on a substrate;
forming a cell trench in the epitaxial layer; and
forming a trench gate structure in the cell trench;
wherein the step of forming the trench gate structure in the cell trench further includes:
forming an insulating layer covering an inner wall surface of the cell trench;
forming an initial intermediate dielectric layer covering the insulating layer;
forming a first dielectric layer covering the initial intermediate dielectric layer;
removing a part of the first dielectric layer and a part of the initial intermediate dielectric layer that are located at the bottom side of the cell trench, so as to form an intermediate dielectric layer having the bottom opening and the first dielectric layer having a bottom-side opening, the bottom opening and the bottom-side opening being in communicated with each other;
forming a second dielectric layer filling the bottom opening of the intermediate dielectric layer and the bottom-side opening of the first dielectric layer;
forming a heavily doped semiconductor material in a lower half part of the cell trench;
removing an upper half portion of the first dielectric layer and an upper half portion of the second dielectric layer to form an inner dielectric layer after the step of forming the heavily-doped semiconductor material in the lower half part of the cell trench;
performing a thermal oxidation process so as to oxidize a top portion of the heavily doped semiconductor material, thereby forming an inter-electrode dielectric layer, in which another portions of the heavily-doped semiconductor material are remained un-oxidized form a shielding electrode; and
forming a gate electrode in an upper half part of the cell trench, wherein the gate electrode is isolated from the shielding electrode by the inter-electrode dielectric layer.

10. The method according to claim 9, wherein a bottom part of the insulating layer located at the bottom side of the cell trench is removed during the step of forming the intermediate dielectric layer having the bottom opening so that the second dielectric layer is in contact with a bottom surface of the cell trench after the step of forming the second dielectric layer.

* * * * *